United States Patent [19]

Chané

[11] 3,887,404

[45] June 3, 1975

[54] METHOD OF MANUFACTURING SEMICONDUCTOR DEVICES

[75] Inventor: Jean-Paul Chané, Yerres, France

[73] Assignee: U.S. Philips Corporation, New York, N.Y.

[22] Filed: Jan. 23, 1973

[21] Appl. No.: 326,038

[30] Foreign Application Priority Data

Jan. 27, 1972 France .......................... 72.02669

[52] U.S. Cl. .................... 156/8; 156/17; 252/79.2; 252/79.4

[51] Int. Cl. .......................... H01l 5/00; H01l 7/64

[58] Field of Search ......... 156/17, 8; 252/79.2, 79.4

[56] References Cited

UNITED STATES PATENTS

| | | | |
|---|---|---|---|
| 3,262,825 | 7/1966 | Fuller | 252/79.4 |
| 3,480,491 | 11/1969 | Reisman et al. | 156/17 |
| 3,762,945 | 10/1973 | DiLorenzo | 156/17 |
| 3,765,984 | 10/1973 | Strehlow | 156/17 |
| 3,801,391 | 4/1974 | Dyment et al. | 156/17 |

*Primary Examiner*—Charles E. Van Horn
*Assistant Examiner*—Jerome W. Massie
*Attorney, Agent, or Firm*—Frank R. Trifari; Leon Nigohosian

[57] ABSTRACT

The manufacture of semiconductor devices in which the etching of recesses in semiconductor material of the III-V type is carried out in two steps with differently anisotropically reacting etchants.

Semiconductor material may be deposited epitaxially in the recesses.

21 Claims, 11 Drawing Figures

METHOD OF MANUFACTURING SEMICONDUCTOR DEVICES

Figure 1:
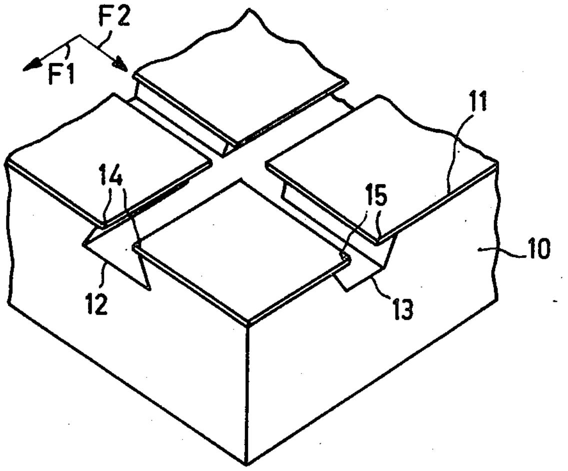

The invention relates to a method of manufacturing semiconductor devices in which recesses are provided according to a given pattern in a part of a body which consists of monocrystalline semiconductor material of the III-V type and is present at a substantially flat surface, by a local etching treatment at said surface and with the use of a mask.

Such recesses may serve, for example, for the division of a semiconductor layer into islands. Semiconductor material may also be deposited epitaxially in said recesses. In this manner, regions can be obtained which are inset in the semiconductor part and which consist of semiconductor material which differs in properties from the adjacent original material.

The recesses can be made by providing on the relevant surface a masking pattern of a material which is resistant against the etching treatment for providing the recesses. The recesses are then determined by the apertures in the mask.

For etching recesses in semiconductor material of the III-V type, various etchants are known, such as various oxidizingly acting solutions and gaseous acids, for example, hydrohalides.

In this known method, recesses are generally obtained which show a polygonal cross-section the upright sides of which generally have unequal lengths. The most regular shape is that of a trapezoid. Furthermore, the edges of the recesses usually are crystallographically differently oriented, as a result of which the upright walls of the recesses mutually can obtain strongly deviating shapes. For a good reproducibility in manufacturing semiconductor devices said different shape is a drawback, in particular when inset semiconductor parts are formed in the recesses.

Another drawback is that the extent of underetching can differ locally. The shape of the groove then depends on the ratio of the etching rates at the bottom and at the edges of the windows, the etching rate of the bottom being constant. Actually, the surface shows a given orientation which is not the case with the edges the crystallographic orientation of which may be arbitrary. As a result of this, inset layers of arbitrary and non-reproducible shapes are obtained after epitaxy.

Said non-uniform shapes can produce field distortions in the manufactured semiconductor device.

One of the objects of the present invention is to mitigate said drawbacks.

The present invention is inter alia based on investigations in which in particular different anisotropic behaviours of chemical etching processes with an oxidizing mixture and etching processes with a gaseous acid have been observed, both as regards the etching of crystallographically differently oriented planes of the III-V semiconductor material and the underetching in various crystallographic devices according to which the local patterns are oriented on the surface of the said material. This behaviour is associated with the affinity of the etchant to the various crystallographic planes of the semiconductor material in question.

It has been found that on a plate of III-V semiconductor material, for example, gallium arsenide, which is oriented according to the (001) plane, oxidizing solutions show a maximum affinity to $A^{III}$-planes (arsenic planes) with $(\bar{1}\bar{1}\bar{1})$ index and gaseous acid etchants, for example, a hydrogenhalide in the gaseous state, show a maximum affinity to the $B^{V}$-planes (gallium planes) with (111) index. As a result of this and due to the fact that they are $(\bar{1}\bar{1}\bar{1})$ planes which appear on the window edges oriented according to the [110] direction, the recess will have a totally different shape, in accordance with the etchant, namely a so-called "dove tail" shape, if the etchant has an oxidizing effect (in this case the $(\bar{1}\bar{1}\bar{1})$ arsenic plane with very high etching rate has fully disappeared) or a trapezoidal shape if the etchant is a gaseous acid, for example, a hydrogenhalide in the gaseous state (in this case the $(\bar{1}\bar{1}\bar{1})$ arsenic plane with very low etching rate is decisive of the shape). It is to be noted that $(11\bar{1})$, $(1\bar{1}1)$ and $(\bar{1}11)$ planes are equivalent to the $(\bar{1}\bar{1}\bar{1})$ plane and $(1\bar{1}\bar{1})$, $(\bar{1}1\bar{1})$ and $(\bar{1}\bar{1}1)$ planes are equivalent to the (111)plane.

It has also been observed that the effect of these two etchants may be complimentary, in particular in the case of windows oriented according to the [110] direction and thus results in recesses having substantially orthogonal edges. However, also for other peripheral directions the compensating effect results in a reduction of deviations in shape.

Finally it has been observed that the use of a surface according to a (001) plane or a plane which is slightly disoriented relative to the (001) plane permits of obtaining very symmetrical recesses with substantially rectangular cross-section.

According to the invention, a method of manufacturing semiconductor devices in which recesses are provided according to a given pattern in a part of a body which consists of monocrystalline semiconductor material of the III-V type and is present at a substantially flat surface, by a local etching treatment at said surface and with the use of a mask is characterized in that the local etching comprises two steps, an oxidizingly acting etchant for the semiconductor material being used in one of these steps and a gaseous acid etching the semiconductor material being used in the other step.

The etching step with the oxidizing etchant is preferably carried out prior to the etching step with the gaseous acid. The etching step with the gaseous acid provides a readily prepared surface in particular for epitaxial deposition of semiconductor material in the recesses.

Semiconductor materials of the III-V type include semiconductor materials of the general formula $A^{III}B^{V}$, where $A^{III}$ may be Al, Ga, In, or a mixture of two or more of these elements and $B^{V}$ may be phosphorus, arsenic, antimony or a mixture of two or more of these elements.

The invention and preferred embodiments thereof will now be described in greater detail with reference to the accompanying drawings.

FIG. 1 is a perspective view of a semiconductor part of the II-V type in which recesses in the form of grooves have been obtained by an oxidizing etching treatment.

Figure 1A:
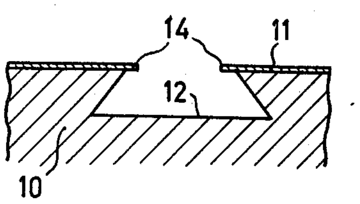

FIG. 1*a* is a sectional view of such a groove which is provided in a given direction.

Figure 1B:
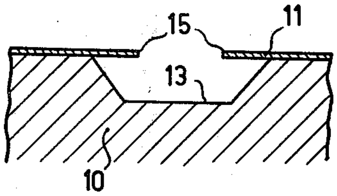

FIG. 1*b* is a sectional view of such a groove which is provided in another direction.

Figure 2:
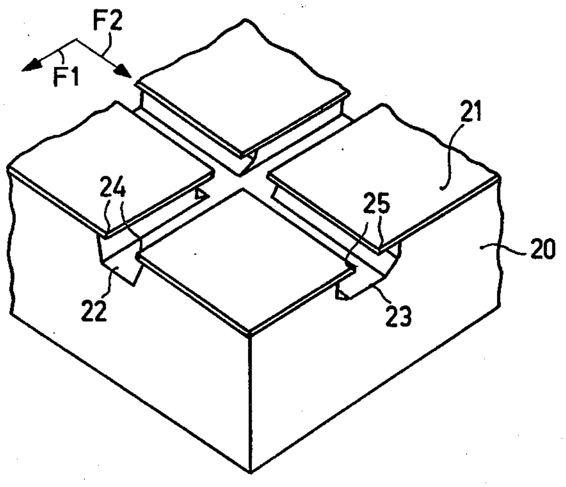

FIG. 2 is a perspective view of a semiconductor part of the III-V type in which recesses in the form of grooves have been obtained by etching by means of a gaseous acid.

Figure 2A:
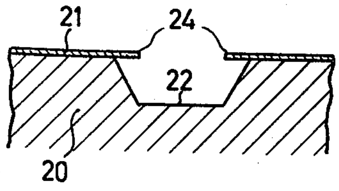

FIG. 2*a* is a sectional view of such a groove which is provided in a given direction.

Figure 2B:
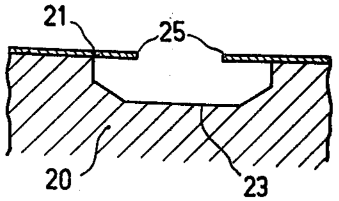

FIG. 2*b* is a sectional view of such a groove which is provided in another direction.

Figure 3:
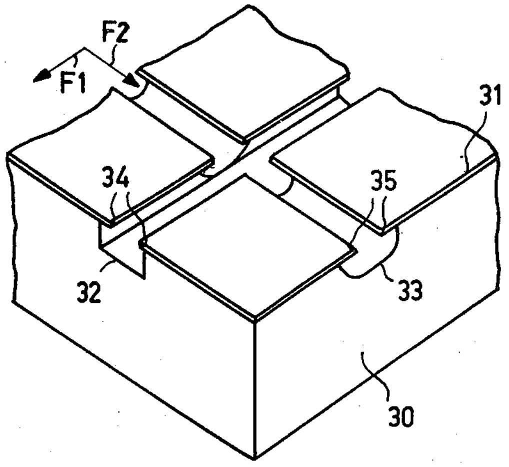

FIG. 3 is a perspective view of a semiconductor part of the III-V type in which the recesses have been obtained by means of the method according to the invention.

Figure 3A:
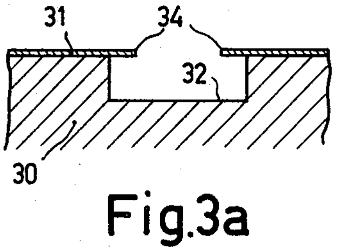

FIG. 3*a* is a sectional view of such a recess which is provided in a given direction.

Figure 3B:
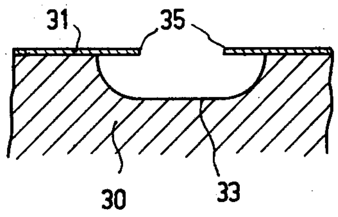

FIG. 3*b* is a sectional view of such a recess which is provided in another direction.

Figure 4A:
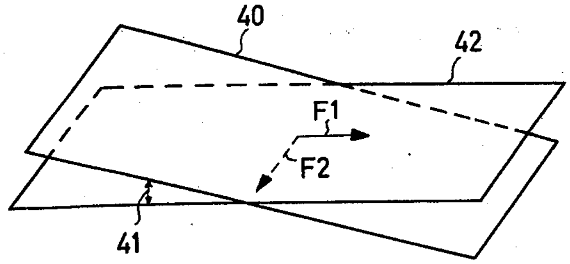

FIG. 4*a* is a perspective view of the plane of a semiconductor part with is disoriented relative to the (001) plane according to a given direction.

Figure 4B:
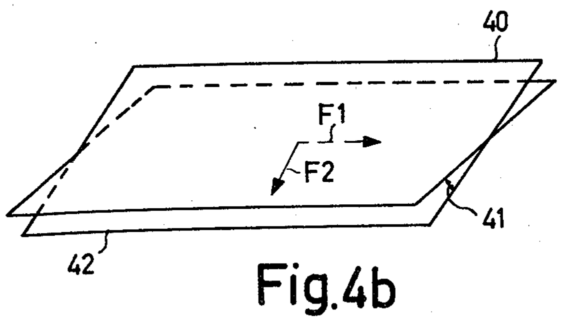

FIG. 4*b* is a perspective view of the plane of a semiconductor part which is disoriented relative to the horizontal (001) plane according to another direction.

It is assumed in FIGS. 1, 2 and 3 that the first phase of the operation has been carried out, namely, that the plane of the substrate is disoriented relative to the (001) plane by 3°.

FIG. 1 shows a plate of semiconductor material of the III-V type which is covered with a silicon oxide layer 11, and two grooves 12 and 13. The two arrows F1 and F2 which are orthogonal relative to each other dennote the directions of orientation [110] and $[1\bar{1}0]$, respectively. The groove 12 is provided according to the direction of orientation [110] and the groove 13 according to the direction of orientation $[1\bar{1}0]$. The underetchings of the groove 12 are denoted by 14 and the underetchings of the groove 13 are denoted by 15.

FIG. 1*a* shows on an enlarged scale the groove 12 in the semiconductor body 10 which is covered with silicon oxide 11, and the underetchings 14.

FIG. 1*b* shows on an enlarged scale the groove 13 in the semiconductor body of III-V type which is covered with silicon oxide 11, and the underetchings 15.

In the case of FIG. 1, the etching treatment has been carried out with an oxidizing agent. It is found that the groove 12 according to the [110] direction has a so-called "dove tail shape" (FIg. 1*a*) and that the groove 13 according to the [110] direction has a trapezoidal shape (FIG. 1*b*). It is also seen that the underetchings are different in accordance with the direction in question, they are more considerable in the $[1\bar{1}0]$ direction than in the [110] direction. The parts 15 of the groove 13 are thus substantially equal to the double of the parts 14 of the groove 12. The [110] direction thus is more favourable for the manufacture of grooves.

FIG. 2 shows a plate-shaped semiconductor body 20 of the III-V type which is covered with a silicon oxide layer 21, and two grooves 22 and 23. The two arrows F1 and F2 which are orthogonal relative to each other denote the directions of orientation [110] and $[1\bar{1}0]$, respectively. So the groove 22 has been made according to the [110] direction of orientation and the groove 23 according to the $[1\bar{1}0]$ direction of orientation. The underetchings of the groove 22 are denoted by 24 and the underetchings of the groove 23 are denoted by 25.

FIG. 2*a* shows on an enlarged scale the groove 22 in the semiconductor material 20 which is covered with silicon oxide, and the underetchings 24.

FIG. 2*b* shows on an enlarged scale the groove 23 in the semiconductor body 20 which is covered with silicon oxide 21, and the underetchings 25.

In the case of FIG. 2, etching has been carried out with a gaseous acid etchant. It is found that the groove 22 according to the [110] direction has a trapezoidal shape (FIG. 2*a*), whereas the groove 23 in the $[1\bar{1}0]$ direction has a polygonal shape. As in the above case, the underetchings 25 of the groove 23 are more considerable than the underetchings 24 of the groove 22 and as a result of this the [110] direction is more favourable for the manufacture of the grooves than the $[1\bar{1}0]$ direction.

FIG. 3 shows a plate of semiconductor material 30 of the III-V type which is covered with a silicon oxide layer 31, and two grooves 32 and 33. The two arrows $F_1$ and $F_2$ which are orthogonal relative to each other denote the [110] and $[1\bar{1}0]$ directions of orientation, respectively, the groove 32 being provided according to the [110] direction of orientation and the groove 33 being provided according to the $[1\bar{1}0]$ direction of orientation. The underetchings of the groove 32 are denoted by 34 and the underetchings of the groove 33 are denoted by 35.

FIG. 3*a* shows on an enlarged scale the groove 32 in the semiconductor body 30 which is covered with silicon oxide 31, and the underetchings 34.

FIG. 3*b* shows on an enlarged scale the groove 33 in the semiconductor body 30 which is covered with silicon oxide 31, and the underetchings 35.

In this case the etching treatment has been carried out by means of the method according to the invention. It is found that according to the [110] direction the groove 32 shows an orthogonal and regular shape (FIG. 3*a*), whereas in the $[1\bar{1}0]$ direction the groove 33 is slightly widened in the manner of a cup (FIG. 3*b*).

The plates may have thicknesses in the order of 110 $\mu$, the manufactured grooves have a depth in the order of 10 $\mu$.

In FIG. 4*a*, the plane of the substrate 40 has been disoriented over a small angle 41 relative to the horizontal (001) plane 42. The [110] direction is denoted by the solid-line arrow $F_1$. The tilting of the plane has been carried out about the $[1\bar{1}0]$ axis denoted by the broken-line arrow $F_2$.

In FIG. 4*b* the plane of the substrate 40 has been disoriented differently over a small angle 41 relative to the horizontal (001) plane 42. The $[1\bar{1}0]$ direction is denoted by the solid-line arrow $F_2$. This time the tilting of the plane has been carried out about the [110] axis denoted by the broken-line arrow $F_1$.

Experience has taught that the disorientation by rotation about the $[1\bar{1}0]$ axis (FIG. 4*a*) is most favourable to obtain the desired symmetric grooves and for this reason said disorientation has been chosen in the example. It is assumed that said disorientation in the case of FIGS. 1, 2 and 3 has been made previously. In that case the preferred disorientated axial direction and the preferred direction of the grooves manufactured according to the invention are the same, namely in both cases the [110] direction.

According to the method of the invention there is proceeded as follows. Starting material is a block of semiconductor material III-V which is cut according to a plane which is slightly disoriented relative to the (001) plane over an angle of 2° to 4° by rotation about the $[1\bar{1}0]$ direction of orientation. It is desirable to disorient the plane so as to avoid macroscopic defects in connection with epitaxial deposition of semiconductor material. The disorientation permits a homogeneous distribution of the points of attack for the deposition. A mechanical-chemical polishing treatment is then carried out on said surface by means of a sodium hypochlorite solution, for example in the case in which the semiconductor material is gallium arsenide, or in general with a solution of bromomethanol for all III-V semiconductor materials. Then the whole surface is subjected to a chemical etching treatment by means of an acid liquid so as to remove a thickness of a few microns, for example 2 to 3 microns, which thickness corresponds to the zone disturbed by the mechanical-chemical etching treatment. This etching is carried out by dipping the plate in a solution in a beaker.

The solution may be, for example, a solution of pure suphuric acid, hydrogen peroxide and deionized water the volume ratio of which is 3 to 6 for sulphuric acid, 1 for hydrogen peroxide and 0.8 to 1.2 for deionized water, for example, a mixture 5+1+1. A protective layer is then provided on the surface, which layer may be, for example, silicon oxide or silicon nitride. The windows are then provided in the protective layer by photo-etching, through which windows the grooves are manufactured; the principal direction of said windows extends approximately according to the [110] direction of orientation which is previously provided on the surface.

An etching treatment with an oxidizing mixture is then carried out. The oxidizing mixture may be, for example, bromomethanol (with a percentage by weight of bromine of 3 to 5 percent) or a mixture of 10 percent by weight of alkalihydroxide solution in water, hydrogen peroxide of 110 vol. and deionized water in the respective volume ratios of 2 to 4 for alkalihydroxide, 1 for hydrogen peroxide and 0.8 to 1.2 for deionized water, for example a mixture 3 + 1 + 1. Hydrogen peroxide of 110 vol. is to be understood to be a hydrogen peroxide solution which, upon complete decomposition of $H_2O_2$ in water and oxygen, provides 110 parts by volume of oxygen of atmospheric pressure. This corresponds approximately to a hydrogen peroxide content of well over 30 percent by weight. The oxidizing mixture may also be, for example, a mixture of pure sulphuric acid, hydrogen peroxide of 110 vol. and deionized water in the volume ratios of 1 for sulphuric acid, 8 to 15 for hydrogen peroxide and 0.8 to 1.2 for deionized water, for example, a mixture 1 + 12 + 1. Said mixture attacks the semiconductor material through the opened window and forms a groove which substantially has the so-called "dove tail shape" (see FIG. 1). The plate is then subjected to a final etching treatment with a gaseouos acid at high temperature, said etchant in turn recessing the semiconductor material inside the window, for example, according to a trapezoidal shape (see FIG. 2). The combined effect of the two types of etchants gives the manufactured grooves an orthogonal shape.

The etching periods relating to the various treatment phases have been determined in preceding experiments, which permits making a scale division providing the etching periods as a function of the groove thicknesses which it is desirable to obtain. Otherwise, the etching periods depend upon the widths of the windows in which they are carried out. For example, for a window of 50 microns and an etching of 5$\mu$u in gallium arsenide by an oxidizing mixture of pure sulphuric acid, hydrogen perioxide of 110 vol. and deionized water in the volume ratios of, for example, 1 + 12 + 1, the required time is 40 seconds at room temperature. A gaseous acid etchant which is then operative for 5 seconds is sufficient to rectify the groove, it being deepened with a thickness in the order of 1 micron, When localized epitaxy is carried out, the final etching treatment is carried out in a reactor with hydrogen-halide acid, for example, hydrochloric acid in the gaseous state, the elevated temperature at which the operation is to be carried out being taken into account.

It is then possible to proceed to epitaxial growth according to known methods.

The semiconductor material of the III-V type which is usually used is gallium arsenide or AsGa.

The method according to the invention enables in future the manufacture of localized inset layers with a satisfactory geometry, which enables the use in high speed microelectronics as a result of the fact that the electric field distortions are then remarkably reduced.

What is claimed is:

1. A method of producing a semiconductor device comprising at least one recess, comprising the steps of:

a. providing a body comprising a surface portion that defines a substantially flat surface, said surface portion consisting essentially of an $A^{III} B^{V}$ material;

b. providing a mask at said surface to cover a first portion thereof;

c. selectively etching only a part of said surface that is un-covered by said mask by subjecting said part to an oxidizing etchant passed through an opening in said mask; and d. selectively etching said part by separately subjecting said part of said surface portion to a gaseous acid etchant passed through an opening in said mask.

2. A method as claimed in claim 1, wherein said step of exposing said part to said oxidizing etchant is carried out prior to said step of exposing said part to said gaseous acid etchant.

3. A method as claimed in claim 1, wherein the component of said material represented by A is gallium.

4. A method as claimed in claim 1, wherein the component of said material represented by B is arsenic.

5. A method as claimed in claim 1, wherein said oxidizing etchant comprises bromine in a liquid.

6. A method as claimed in claim 5, wherein said oxidizing etchant is a mixture of an alkanol and bromine.

7. A method as claimed in claim 6, wherein said alkonol is methanol.

8. A method as claimed in claim 5, wherein the bromine is present in a concentration of about 3 to 5 percent by weight.

9. A method as claimed in claim 1, wherein said oxidizing etchant consists essentially of an alkaline hydrogen peroxide solution.

10. A method as claimed in claim 9, wherein said oxidizing etchant is a mixture containing 2 to 4 parts by volume of a 10 percent by weight solution of alkalihyroxide in water, 1 part by volume of hydrogen peroxide of 110 vol. and 0.8 – 1.2 parts by volume of water.

11. A method as claimed in claim 1, wherein said oxidizing etchant is essentially composed of sulfuric acid, hydrogen peroxide and water.

12. A method as claimed in claim 11, wherein said oxidizing etchant is a mixture containing 8 to 15 parts by volume of hydrogen peroxide of 110 vol. 1 part by volume of pure sulfuric acid and 0.8 – 1.2 parts by volume of water.

13. A method as claimed in claim 1, wherein said gaseous acid consists essentially of a hydrogen halide.

14. A method as claimed in claim 13, wherein said gaseous acid is hydrochloric acid.

15. A method as claimed in claim 1, wherein said step of etching with a gaseous acid is conducted at an elevated temperature.

16. A method as claimed in claim 1, wherein said surface is oriented substantially in the (001) plane.

17. A method as claimed in claim 16, wherein the orientation of said surface deviates between about 2° and 4° from the (001) plane.

18. A method as claimed in claim 16, wherein the orientation of said surface deviates from the (001) plane according to a rotation about a [110] axis.

19. A method as claimed in claim 16, wherein there are provided a plurality of recesses having respective rectilinear boundaries extending approximately in the [110] direction.

20. A method as claimed in claim 1, wherein there are provided a plurality of recesses respectively comprising boundaries extending approximately in the [110] direction.

21. A method as claimed in claim 1, wherein said mask comprises elongated openings having their respective major axes oriented substantially in the [110] direction.

* * * * *